US006013160A

United States Patent [19]

Raisanen et al.

[11] Patent Number: 6,013,160

[45] Date of Patent: Jan. 11, 2000

[54] METHOD OF MAKING A PRINTHEAD HAVING REDUCED SURFACE ROUGHNESS

[75] Inventors: Alan D. Raisanen, Sodus; Cathie J. Burke, Rochester, both of N.Y.

[73] Assignee: Xerox Corporation, Stamford, Conn.

[21] Appl. No.: 08/976,460

[22] Filed: Nov. 21, 1997

[51] Int. Cl.[7] .................................................. C23C 14/34

[52] U.S. Cl. ................................ 204/192.15; 204/192.21

[58] Field of Search ......................... 204/192.12, 192.15, 204/192.16, 192.21

[56] References Cited

U.S. PATENT DOCUMENTS

| | | | |
|---|---|---|---|
| Re. 32,572 | 1/1988 | Hawkins et al. | 156/626 |
| 4,336,548 | 6/1982 | Matsumoto | 346/140 R |
| 4,774,530 | 9/1988 | Hawkins | 346/140 R |
| 4,951,063 | 8/1990 | Hawkins et al. | 346/1.1 |
| 5,287,622 | 2/1994 | Terai | 29/890.1 |
| 5,469,200 | 11/1995 | Terai | 347/63 |

OTHER PUBLICATIONS

Michael O'Horo et al. entitled "Effect of TIJ Heater Surface Topology on Vapor Bubble Nucleation", SPIE Journal, vol. 2658, pp. 58–64, Jan. 29, 1996.

*Primary Examiner*—Nam Nguyen
*Assistant Examiner*—Gregg Cantelmo

[57] ABSTRACT

The nucleation efficiency of a thermal ink jet printhead is improved by providing a heater resistor with a thin planar oxide film formed over a conductive heater resistive layer. In a preferred embodiment, zirconium diboride is sputtered onto a silicon substrate surface to form a first, electrically conductive base portion of the resistor. At a predetermined time, during the sputtering process, oxygen is introduced to form a thin film of $ZrB_2O_x$. The surface of this film is very smooth having a surface roughness of <5 nm RMS.

3 Claims, 2 Drawing Sheets

METHOD OF MAKING A PRINTHEAD HAVING REDUCED SURFACE ROUGHNESS

BACKGROUND OF THE INVENTION AND MATERIAL DISCLOSURE STATEMENT

The invention relates generally to thermal ink jet printing and, more particularly, to printheads with resistive heaters provided with improved drop ejection efficiency.

Thermal ink jet printing is generally a drop-on-demand type of ink jet printing which uses thermal energy to produce a vapor bubble in an ink-filled channel that expels a droplet. A thermal energy generator or heating element, usually a resistor, is located in the channels near the nozzle a predetermined distance therefrom. An ink nucleation process is initiated by individually addressing resistors with short (2–6 μsecond) electrical pulses to momentarily vaporize the ink and form a bubble which expels an ink droplet. As the bubble grows, the ink bulges from the nozzle and is contained by the surface tension of the ink as a meniscus. As the bubble begins to collapse, the ink still in the channel between the nozzle and bubble starts to move towards the collapsing bubble, causing a volumetric contraction of the ink at the nozzle and resulting in the separating of the bulging ink as a droplet. The acceleration of the ink out of the nozzle while the bubble is growing provides the momentum and velocity of the droplet in a substantially straight line direction towards a recording medium, such as paper.

The environment of the heating element during the droplet ejection operation consists of high temperatures, thermal stress, a large electrical field, and a significant cavitational stress. Thus, the need for a cavitational stress protecting layer over the heating elements was recognized early, and one very good material for this purpose is tantalum (Ta), as is well known in the industry.

It has been demonstrated that nucleation efficiency is dependent upon the properties of the heater surface. (See article by Michael O'Horo et al. entitled "Effect of TIJ Heater Surface Topology on Vapor Bubble Nucleation", SPIE Journal, Vol 2658, pgs. 58–64, Jan. 29, 1996). In this article, experimental observation showed that vapor bubble nucleation consisted of two types; homogeneous nucleation and heterogeneous nucleation. Homogeneous nucleation occurs in the ink spontaneously when the nucleation temperature is reached. Heterogeneous nucleation usually occurs at surface sites (cracks and crevices) of the resistive heater. The surface sites contain trapped gases or vapors which cause the initiation temperature for heterogeneous nucleation to be considerably lower than that of homogeneous nucleation. The energy stored in the ink and consequent efficiency of vapor bubble expansion is significantly reduced Prior art related to the control of surface roughness of ink jet heater elements for control of vapor bubble nucleation includes U.S. Pat. No. 4,336,548, which describes techniques and materials used to fabricate a thermal inkjet printhead with increased surface roughness, much greater than the roughness that is described here, which is used to enhance the degree of heterogeneous nucleation during vapor bubble formation. This is accomplished by roughening the surface of the substrate layer by sandblasting, etching, or other technique prior to the deposition of the heater resistor material and passivation stack. Although these techniques do in fact result in vapor bubble nucleation with lower energy input, the drops ejected will be much less energetic and, hence, less efficient, than a drop generated by homogeneous vapor bubble nucleation, since the degree of superheating of the ink is lower. The '548 patent, like the present patent, calls out the use of hafnium and zirconium diborides, among other materials, as heater elements, as well as zirconium oxide as a heater passivation material U.S. Pat. No. 5,287,622, on the other hand, describes the use of laser or electron beam melting (among other techniques) of the substrate surface to produce a relatively smooth surface prior to deposition of the heater resistor and passivation stack, which also includes metal diborides as heater materials, oxides as passivation dielectrics, and tantalum as a protective layer. However, in both of these example of prior art, diborides are used only as thermal energy generation layers (heater resistors), and any modification of the surface finish of the heater is provided only by the degree of smoothing of the substrate. No effort is made to modify the deposition of the heater material or passivation materials to enhance the smoothness of the final heater surface. In addition, the heater element material and the passivating oxide, if any, are deposited sequentially, using two different sputtering targets or other deposition sources, in both of these patents, whereas in the present work the heater material and oxide layer are deposited in-situ by simply modifying the deposition conditions at the end of the deposition sequence, a significant improvement with regards to manufacturability and the integrity of the heater/passivation interface. The structure described in the present patent is further advantaged relative to prior art since the substrate (a polished microelectronics-type single-crystal silicon wafer with a thermally-grown oxide) is already extremely smooth and requires no further processing. The present patent describes a technique whereby the already relatively smooth heater produced by virtue of fabricating it on a smooth singlecrystal silicon substrate is further smoothed by depositing a fine-grained metal diboride heater element and oxidizing its surface layer in situ during the heater material deposition, resulting an integrated heater/passivation stack with sub-nanometer scale roughness values (up to 2 orders of magnitude better than the heaters described in U.S. Pat. No. 5,287,622).

The preferred material for resistive heaters is polysilicon, or sputtered thin-film resistor materials such as zirconium diboride ($ZrB_2$). Polysilicon is comprised of numerous grains whose size and roughness varies with deposition conditions, subsequent high temperature cycling, and doping levels. Polysilicon surface roughness for a high dose implant heater (heater 2 described in the O'Horo article) is 27.2 nm. The surface roughness we can obtain for as-deposited $ZrB_2$ is 0.5 nm. The resistive heater is then passivated with either a thermally grown oxide layer or pyrolytic CVD deposited silicon nitride, both of which are largely conformal; e.g. closely reproduce the polysilicon surface roughness on the surface of the passivation layer. A layer of tantalum is optionally sputtered onto the passivation layer, which substantially replicates the underlying topography, as well as adding some additional topography, on the order of 15 nm RMS or greater, due to the Ta grain structure. Therefore, the surface of the tantalum layer reproduces the surface side and hence, roughness of the underlying polysilicon and the nucleation efficiency of a heater structure of this type (polysilicon or $ZrB_2$ with conventional dielectric passivation layer and tantalum) is not optimum.

From the above, it is evident that a smoother surface of the resistive heater surface would increase nucleation efficiency by reducing the number of vapor-trapping cracks or crevices. U.S. Pat. No. 5,469,200 discloses techniques used to polish the substrate of a heater resistor to improve flatness and, in another example, to form a thermal oxide by oxidizing the substrate surface concurrently with a thermally softening step, resulting in a smoother surface on the oxide passivation layer. These techniques are not entirely satisfactory because of the excessively high temperatures and/or long heating cycles, resulting in incompatibility with integrated microelectronics circuitry. In addition, these techniques reduce the surface topography of the final heater surface simply by altering the topography of the initial substrate surface, and make no attempt to reduce the topography introduced by the resistive heater element and its' passivation stack, thus limting the degree of smoothness obtainable.

SUMMARY OF THE INVENTION

It is, therefore, an object of the present invention to improve the nucleation efficiency of a resistive heater used in thermal ink jet printheads by providing a resistive heater with a smoother surface. This object is realized by forming a very smooth-surfaced resistive heater of a fine-grained thin film resistive material, zirconium diboride, in a preferred embodiment, by a sputtering process which includes the introduction of oxygen at a controlled rate towards the end of the formation of the initial conductive layer. Introduction of the oxygen forms a thin film on top of the underlying conductive layer which has a greatly increased sheet resistance and retains the very smooth topography (less than 0.5 nm RMS) at the surface.

More particularly, the invention relates to a thermal ink jet printhead, including:

a substrate in which one surface thereof has an array of heating resistors and addressing electrodes formed thereon, the heating resistors characterized by comprising a first layer of a sputtered thin-film resistive compound of the general formula $(A)B_2$ where B is boron and A is a metal from the group comprising zirconium (Zr), molybdenum (Mo), hafnium (Hf), niobium (Nb), tantalum (Ta), titanium (Ti), vanadium (V), and tungsten (W), and a second oxide layer overlying said first layer, the second layer having a general formula $(A)B_2O_x$.

The invention also relates to a method for fabricating an improved printhead for use in an ink jet printer, the printhead including a plurality of ink filled channels in thermal communication with at least one section of a heated resistor, comprising the steps of:

(a) sputtering a layer of resistive material of the general formula $(A)B_2$ on the surface of a substrate, (b) introducing oxygen at the end of the sputtering step to form an oxide layer of relatively high sheet resistance overlying the layer of resistive material, the resulting oxide layer having a surface roughness of <0.5 nm RMS, and (c) forming a plurality of ink channels filled with ink in thermal communication with a heated resistor.

DESCRIPTION OF THE INVENTION

Figure 1:
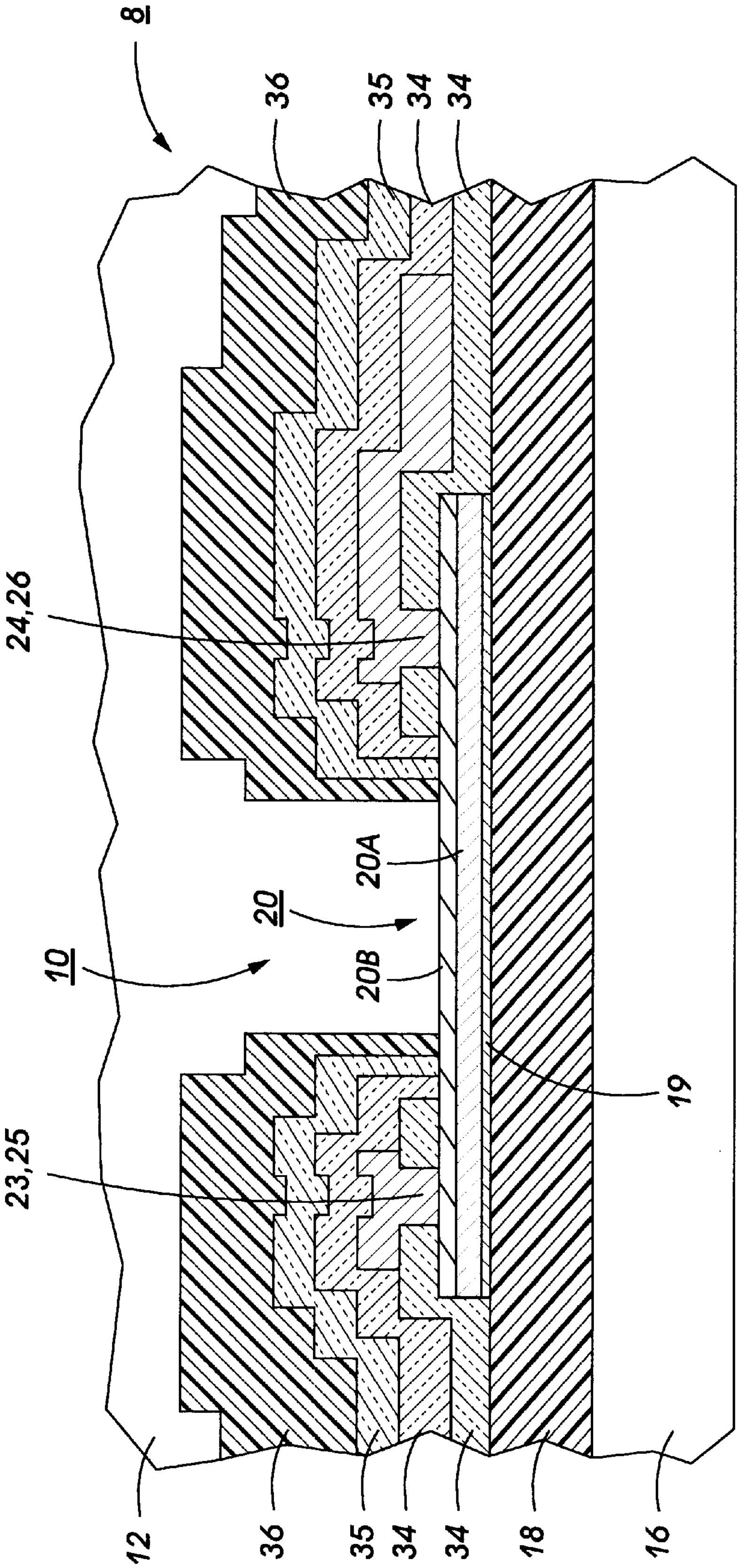
FIG. 1 is a cross-sectional view of a first embodiment of the improved heater resistor of the present invention.

FIG. 1 is a cross-sectional view of a first embodiment of an improved resistive heater structure which can be used, for example, in a printhead of the type disclosed in U.S. Pat. Nos. Re. 32,572, 4,774,530 and 4,951,063, whose contents are hereby incorporated by reference. It is understood that the improved heater structures of the present invention can be used in other types of thermal ink jet printheads where a resistive element is heated to nucleate ink in an adjoining layer.

Referring to FIG. 1, the heater substrate portion of an ink jet printhead 8 is shown with ink in channel 10 being ejected from nozzle 12 formed in the front face. Printhead 8 is fabricated by a conventional process (except for the formation of the heater resistor) by bonding together channel and heater plates as disclosed in U.S. Pat. Nos. Re. 32,572 and 4,951,063, referenced supra. A silicon substrate 16 has an underglaze layer 18 formed on its surface. In one embodiment, it is a thermal field oxide. A gate oxide layer 19 is formed on the surface of layer 18 if the chip also has active circuitry. The gate oxide is formed as a component of active MOS transistor devices elsewhere on the chip, and in the heater structure simply acts to slightly increase the amount of oxide underglaze beneath the resistive heater element. Heater resistors 20 are formed on layer 19. According to the invention, and in a preferred embodiment, a resistor 20 comprises two layers, 20A, 20B, shown in enlarged detail in FIG. 2. Layer 20A, in a preferred embodiment, is zirconium diboride, which is sputtered onto layer 19 to a depth of approximately 0.5 $\mu$m. The zirconium diboride comprising layer 20A is electrically conductive with a sheet resistance of 5–1000 ohms/square and a surface roughness less than 0.5 nm RMS. Layer 20B is a thin film of 200 angstroms to 1 micron of zirconium diboride oxide, which is formed by introducing a small oxygen flow into the sputtering chamber following the formation of layer 20A, and while $ZrB_2$ deposition is occurring. Incorporation of oxygen during film growth causes the sheet resistance of the zirconium diboride to increase dramatically, resulting in a layer 20B with a sheet resistance exceeding 7000 ohms/square. Even more significantly, film 20B retains the smooth topography of the underlying layer, which is significantly smoother than the prior art polysilicon resistors. A silicon nitride or oxide layer may also be used to form layer 20B, but such an ex-situ deposited film will result in a significantly rougher surface finish and reduces the benefit obtained from the ultra-smooth heater resistor material in layer 20A. Layer 20B is masked and etched along with layer 20A to produce a heater resistor element of the proper dimensions. A tantalum layer 30 (FIG. 2) is optionally formed over layer 20B. This tantalum layer would, however, also significantly increase the roughness of the final heater surface, limiting the final roughness obtainable to that of the tantalum film itself, about 12–15 nm RMS depending on deposition conditions. For electrode passivation, a glass film 34 is deposited, then masked and etched through the glass layer 34 and also the oxidized zirconium diboride layer 20B to form vias 23, 24 at the edges of the resistor, which are used for subsequent interconnection to the aluminum addressing electrode 25 and aluminum counter return electrode 26, respectively. One or more additional passivation glass layers 34 may be deposited over the heater interconnection electrodes for devices that require more than one metal interconnect layer elsewhere on the chip, followed by a final ionic-diffusion resistant passivation layer 35, which is typically a plasma-enhanced silicon nitride material A thick film insulative layer 36 is deposited and patterned to form ink delivery channels and nozzle structures 10. Layer 36 is polyimide in a preferred embodiment.

Figure 2:
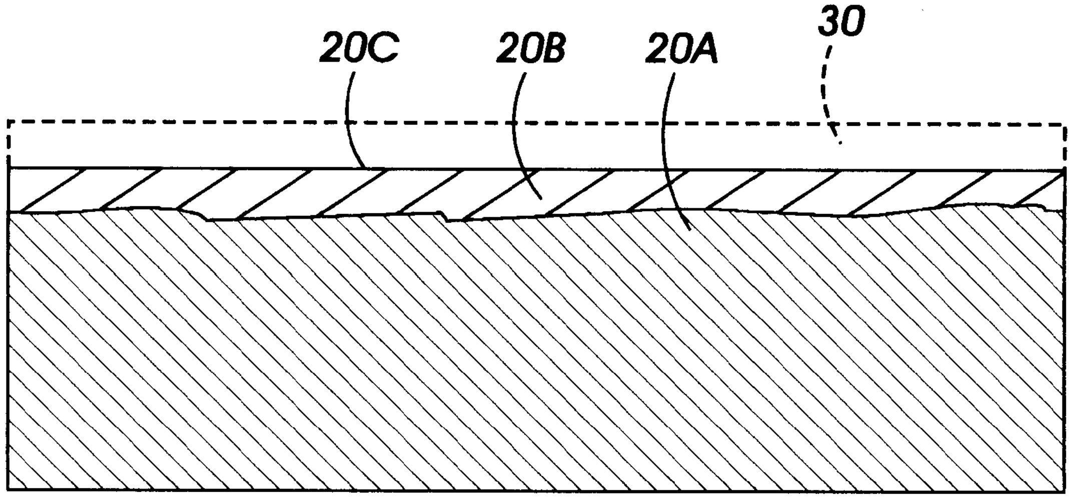
FIG. 2 is a further enlarged cross-sectional view of the resistor of FIG. 1.

Referring to FIG. 2, the $ZrB_2O_x$ layer 20B is shown as overlying the surface of the sputtered $ZrB_2$ and forming an ultra-smooth surface 20. Other materials which are suitable for layer 20A are metal diborides from groups 4A, 5B, and 6B of the periodic element table and, preferably, from the group comprising zirconium, niobium, tantalum, titanium, vanadium, tungsten, molybdenum and hafnium. While the embodiment disclosed herein is preferred, it will be appreciated from this teaching that various alternative, modifications, variations or improvements therein may be made by those skilled in the art. All such modifications are intended to be encompassed by the following claims:

We claim:

1. A method for fabricating an improved printhead for use in an ink jet printer, the printhead including a plurality of ink filled channels in thermal communication with at least one section of a heated resistor, comprising the steps of:

(a) sputtering a layer of resistive material of the formula $(A)B_2$ where B is boron and A is a metal from the group consisting of zirconium, molybdenum, hafnium, niobium, tantalum, titanium, vanadium, and tungsten on the surface of a substrate, (b) introducing oxygen at the end of said sputtering step to form an oxide layer of relatively high sheet resistance overlying the layer of resistive material, the oxide layer having a surface roughness of less than 0.5 nm RMS and a formula $(A)B_2O_x$, and (b) forming a plurality of ink channels filled with ink in thermal communication with a heated resistor.

2. The method of claim 1 wherein the resistive material is zirconium diboride.

3. The method of claim 1 further including the step of forming a tantalum layer over the oxide layer.

* * * * *